United States Patent
Jin et al.

[11] Patent Number: 6,121,118
[45] Date of Patent: Sep. 19, 2000

[54] CHIP SEPARATION DEVICE AND METHOD

[75] Inventors: Ho Tae Jin, Chungcheongnam-do; In Pyo Hong, Kyungki-do; Byung Man Kim; Jeong Ho Bang, both of Chungcheongnam-do, all of Rep. of Korea

[73] Assignee: Samsung Electronics Co., Ltd., Rep. of Korea

[21] Appl. No.: 09/369,683

[22] Filed: Aug. 5, 1999

[30] Foreign Application Priority Data

Nov. 30, 1998 [KR] Rep. of Korea ............ 98-52003

[51] Int. Cl.$^7$ ............ H01L 21/46; H01L 21/78; H01L 21/301
[52] U.S. Cl. ............ 438/460; 438/106; 438/462; 438/463
[58] Field of Search ............ 438/106, 460, 438/462, 463

[56] References Cited

U.S. PATENT DOCUMENTS 5,933,351  8/1999  Balamurugan .
5,953,590  9/1999  Piper et al. .

*Primary Examiner*—Kevin M. Picardat
*Assistant Examiner*—D. M. Collins
*Attorney, Agent, or Firm*—Skjerven Morrill MacPherson LLP; David T. Millers

[57] ABSTRACT

A method for separating semiconductor devices formed on a semiconductor wafer includes: inscribing the semiconductor wafer along scribe lines; mounting the inscribed semiconductor wafer on a stage including an elastic structure and vacuum suction holes that can be aligned to respective semiconductor chips; applying a vacuum through the vacuum suction holes to hold the semiconductor wafer on the elastic structure; and applying a mechanical force to the semiconductor wafer to break the wafer along the scribe lines and separate the semiconductor devices. A device for separating semiconductor devices formed on a wafer includes a stage including an elastic structure and vacuum suction holes that can be aligned with respective semiconductor chips of the semiconductor wafer and a press for applying mechanical force to the semiconductor wafer on the elastic structure. Since use of a wafer tape is avoided in cutting a semiconductor wafer, package cracking and delamination caused by wafer tape adhesive stuck to the back surface of a semiconductor chip are avoided.

19 Claims, 11 Drawing Sheets

CHIP SEPARATION DEVICE AND METHOD

BACKGROUND OF THE INVENTION

1. Field of the Invention

The present invention relates to a device and a method for separating semiconductor devices formed on a wafer, and more particularly to separating a wafer into individual semiconductor chips without using wafer sawing tape.

2. Description of the Related Arts

After fabrication of integrated circuits a semiconductor wafer, a sawing process separates the semiconductor wafer into individual semiconductor integrated circuit devices for packaging. FIG. 1 is a flowchart depicting a conventional semiconductor packaging process 10. Semiconductor packaging process 10 begins with sawing a semiconductor wafer to separate the wafer into individual semiconductor devices or chips. Before sawing, a wafer sawing tape is typically attached to the back surface of the wafer. The wafer sawing tape keeps the chips together after the sawing. After the sawing, each of the chips is removed from the tape and attached on a die pad of a lead frame. Then, wirebonding connects bonding pads of a chip to respective inner leads of the lead frame with Au or Al wires. Finally, an encapsulant such as an epoxy molding compound encapsulates the semiconductor chip, the wires, and the inner leads and protects the semiconductor chip from the external environment.

FIGS. 2 to 4 illustrate the sawing of a wafer. In particular, FIG. 2 shows a semiconductor wafer 12 attached to a wafer tape 11, and FIGS. 3 and 4 are cross-sectional views taken along the line III—III of FIG. 2 respectively before and after sawing. Wafer mounting for sawing attaches wafer tape 11 to the backside (the side without integrated circuit patterns) of semiconductor wafer 12 and a wafer ring 13 to wafer tape 11 on the same side as semiconductor wafer 12. Wafer ring 13 facilitates handling of wafer 12. Wafer tape 11 is typically a 80 $\mu$m to 120 $\mu$m thick PVC (Polyvinyl Chloride) or UV (Ultraviolet) sensitive tape, and the inner diameter of wafer ring 13 is greater than the diameter of wafer 12. After the wafer mounting, wafer 12 is transferred to a wafer sawing (or cutting) apparatus as mounted on tape 11 and supported by wafer ring 13.

In sawing wafer 12, a rotating diamond blade moves along scribe lines 14, which are between the semiconductor devices. The blade cuts through 90% to 100% of the thickness of wafer 12. In the case of the 100% cutting, the blade may partially cut wafer tape 11. After sawing wafer 12, the separate semiconductor chips 16 (FIG. 4) remain attached to tape 11.

A die attaching apparatus picks up each semiconductor chip 16 from wafer tape 11 and bonds the semiconductor chip 16 to a lead frame. However, a fragment of the adhesive from wafer tape 11 may remain on the back surface of semiconductor chip 16. The remaining adhesive can cause defects in device packaging, particularly in LOC (Lead-On-Chip) packages. For example, the adhesive fragment can cause delamination between the back surface of semiconductor chip 16 and the encapsulant that contacts the back surface. The delamination sometimes causes package cracking, which is one of the most serious problems of plastic packages.

SUMMARY OF THE INVENTION

In accordance with an embodiment of the present invention, a method for separating semiconductor devices formed on a semiconductor wafer includes: inscribing the semiconductor wafer along scribe lines; mounting the inscribed semiconductor wafer on a stage having vacuum suction holes, which can be aligned with respective semiconductor chips; applying vacuum through the vacuum suction holes to hold the semiconductor wafer to the stage; and applying mechanical force to break the semiconductor wafer and separate the semiconductor devices. Inscribing typically cuts through about 40% to 60% of the wafer's thickness.

Another aspect of the present invention provides an apparatus for cutting a semiconductor wafer. The apparatus includes a stage having vacuum suction holes, which can be aligned with respective semiconductor chips of the semiconductor wafer and a press that applies mechanical force to the semiconductor wafer placed on the stage. In one embodiment the, the press is a roller. The mechanical force breaks the semiconductor wafer along grooves formed on scribe lines.

Since the present invention does not require wafer tape when separating devices formed on a semiconductor wafer, the package cracking and delamination caused by the wafer tape adhesive particles stuck to the back surface of a semiconductor chip can be avoided.

BRIEF DESCRIPTION OF THE DRAWINGS

Various features and advantages of the present invention are described with reference to the following detailed description taken in conjunction with the accompanying drawings, wherein like reference numerals designate like structural elements, and in which.

DETAILED DESCRIPTION OF THE PREFERRED EMBODIMENTS

Figure 1:
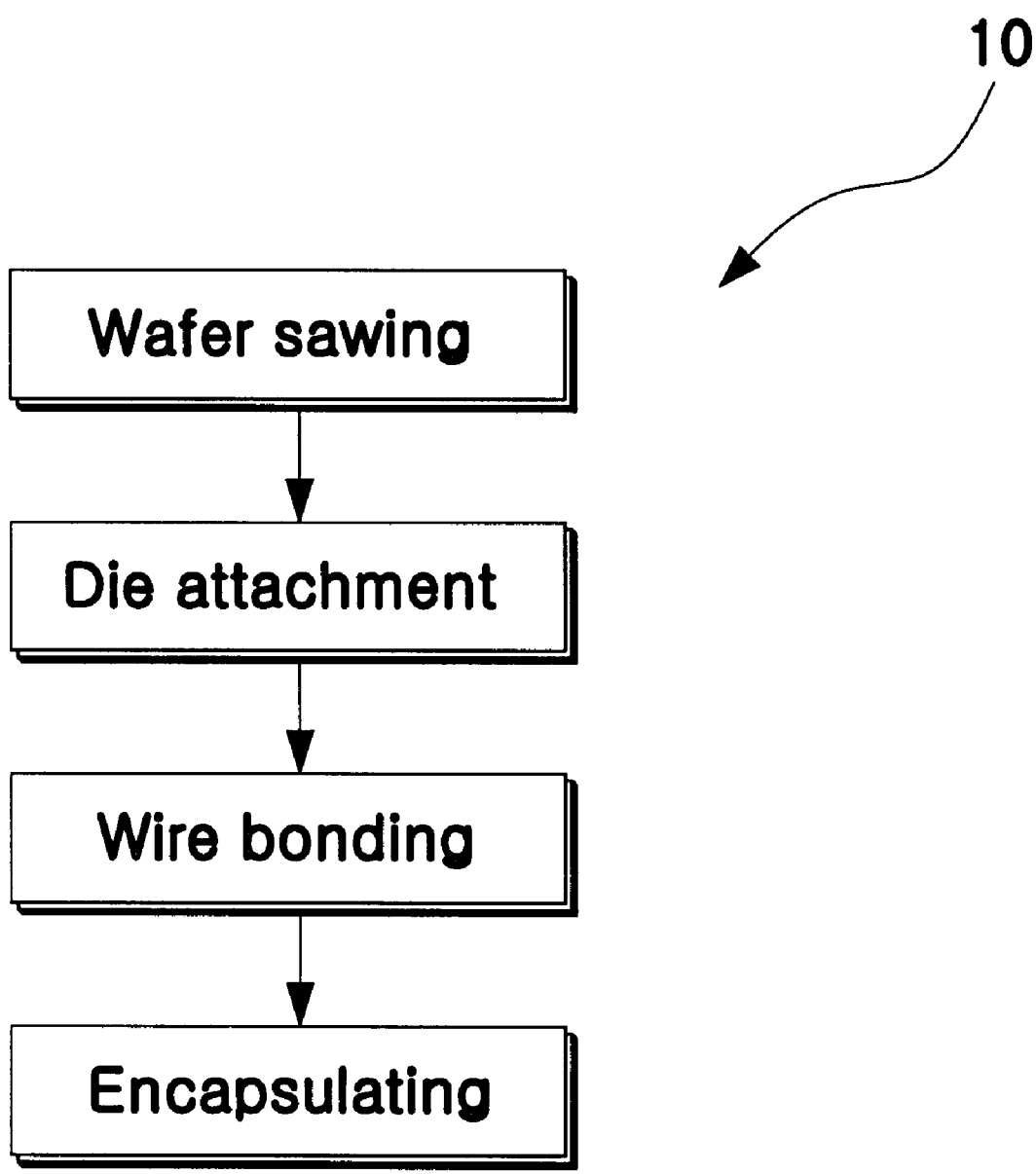
FIG. 1 is a flowchart of a conventional semiconductor packaging process.
Figure 2:
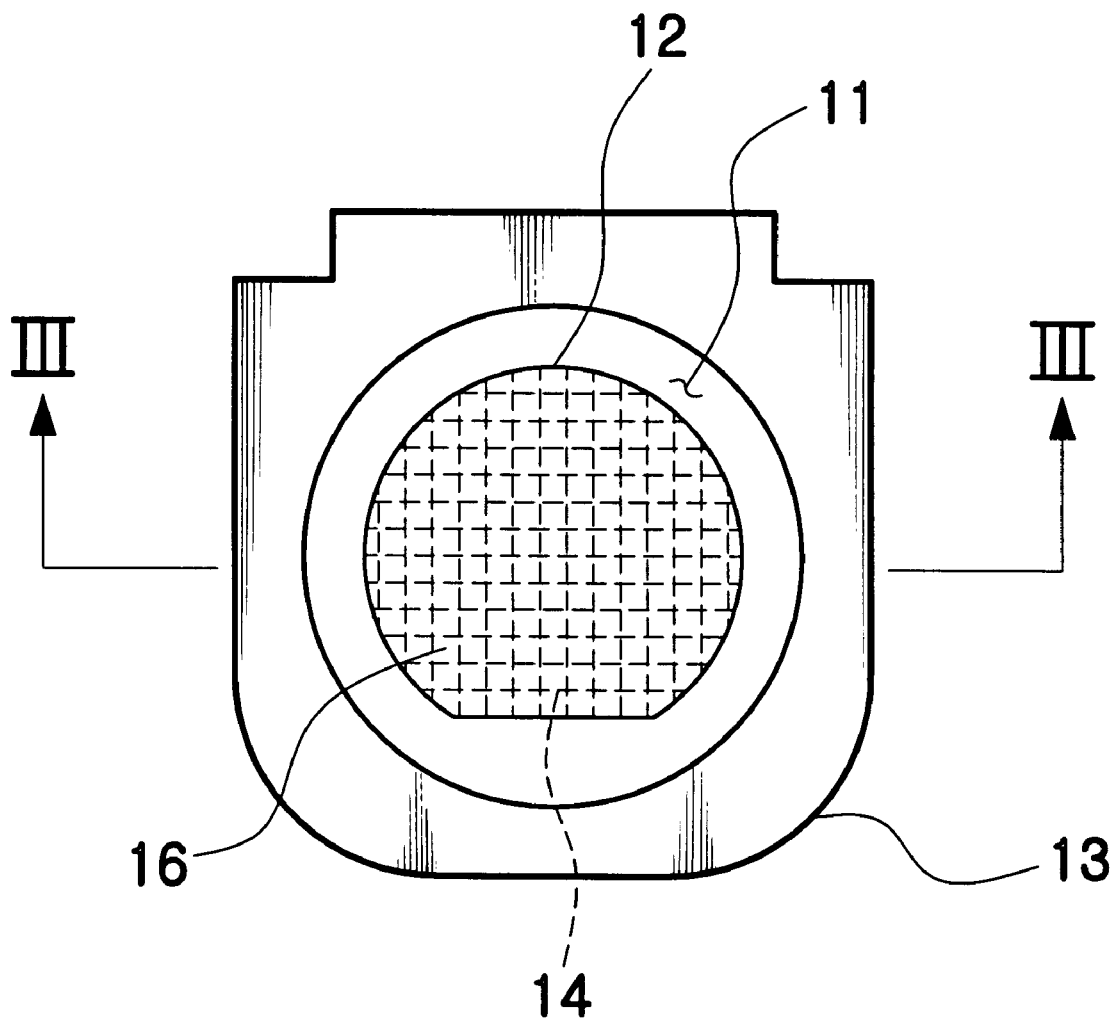
FIG. 2 is a plan view of a semiconductor wafer mounted on a wafer tape.
Figure 3:
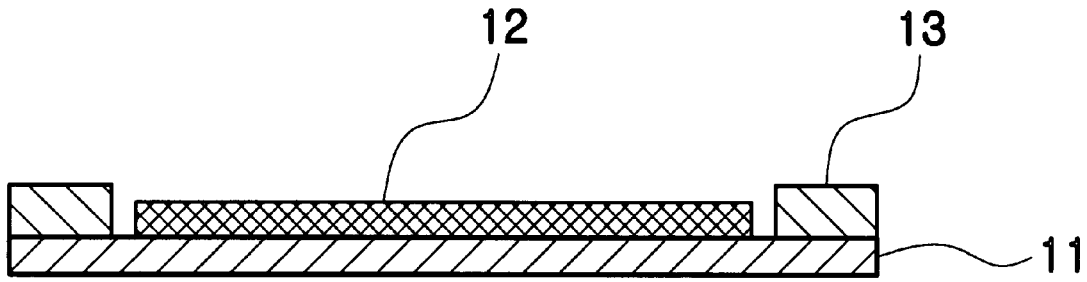
FIGS. 3 and 4 are cross-sectional views taken along line III—III of FIG. 2 before and after sawing.
Figure 4:
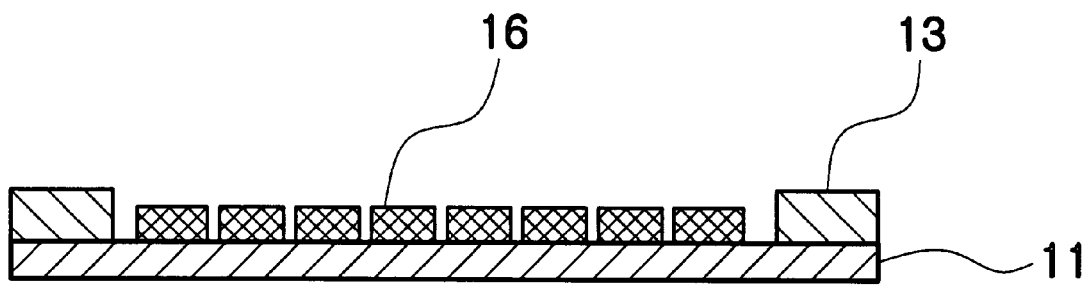
Figure 5:
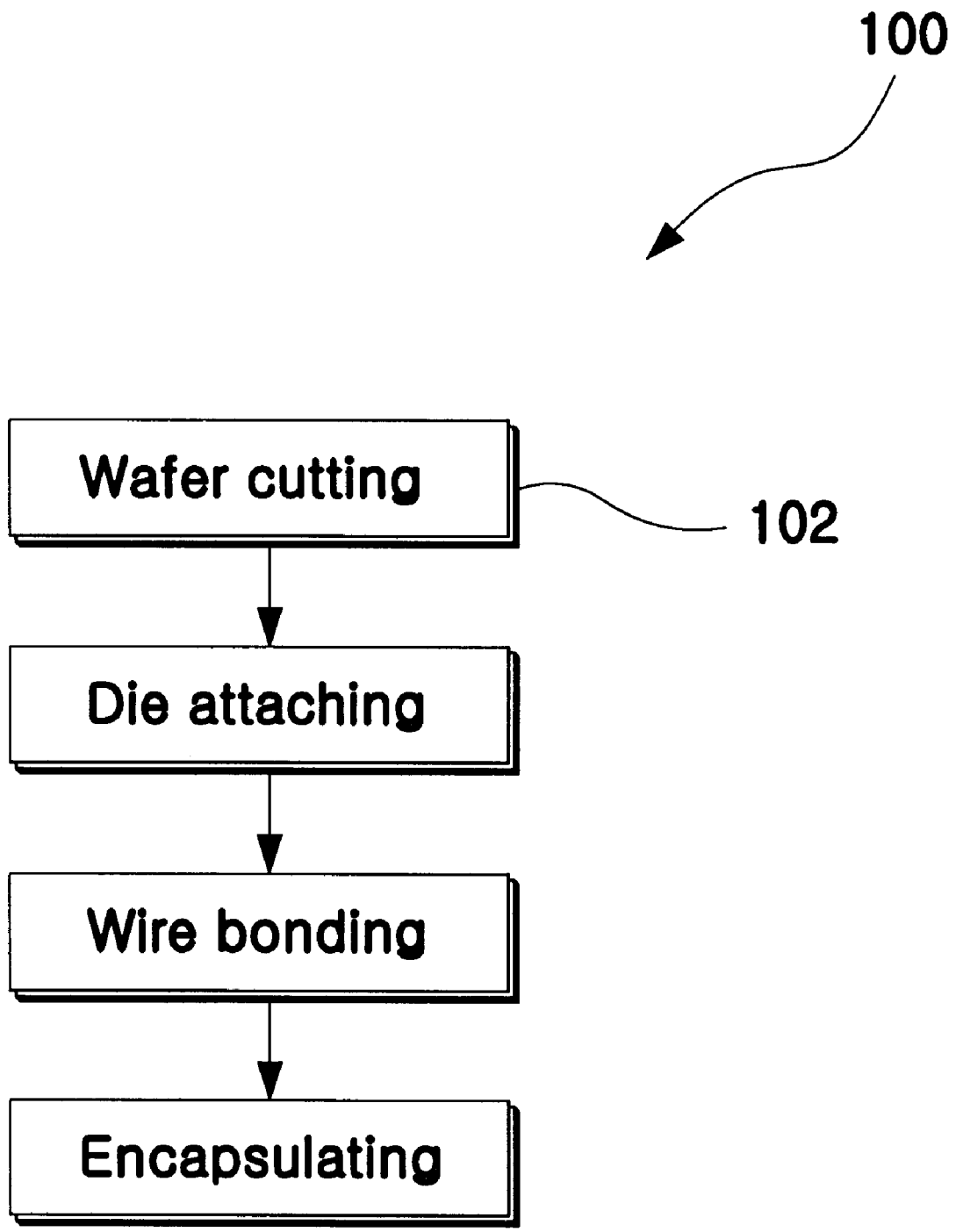
FIG. 5 is a flowchart of a semiconductor packaging process according to an embodiment of the present invention.
Figure 6:
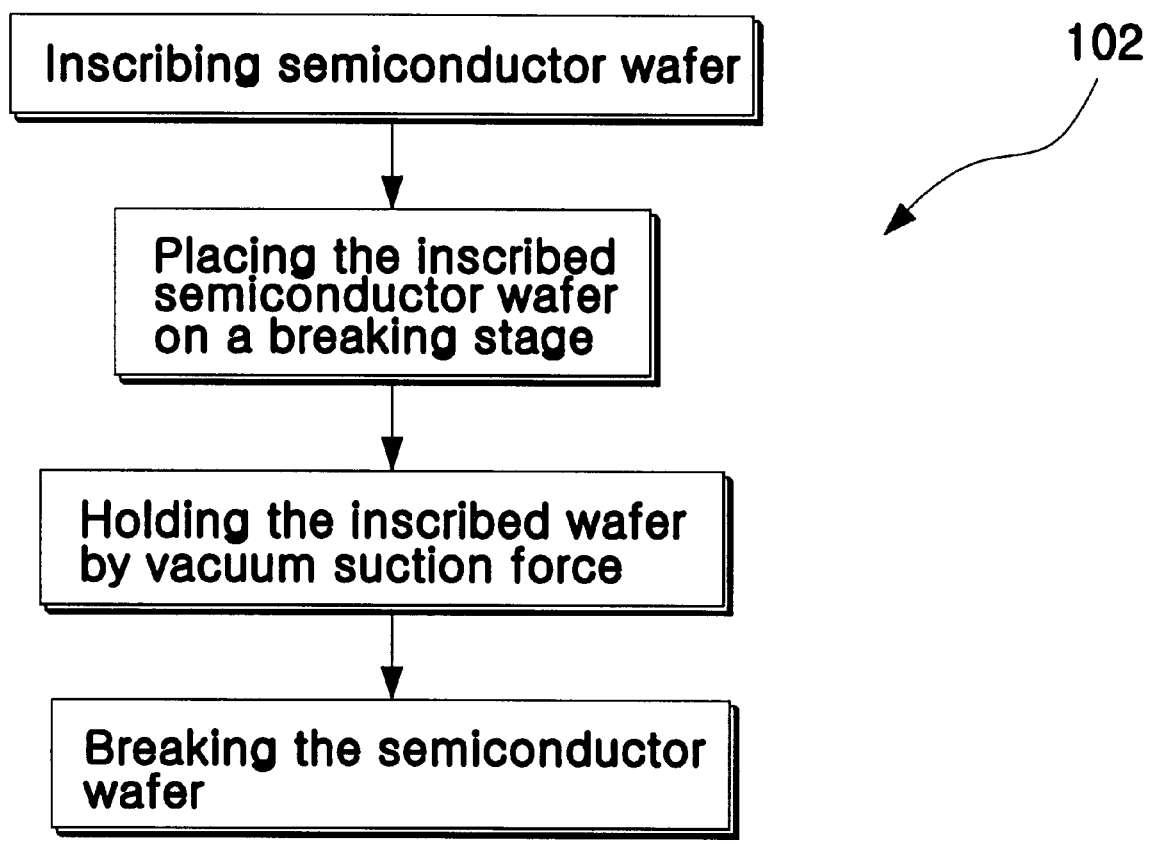
FIG. 6 is a flowchart depicting a wafer cutting process according to an embodiment of the present invention.

FIG. 5 illustrates a semiconductor packaging process 100 including a wafer cutting process 102 in accordance with an embodiment of the present invention illustrated in FIG. 6. Process 102 has the advantage of not requiring or using wafer tape or a wafer ring. Instead, process 102 forms grooves along the scribe lines of a semiconductor wafer in a process referred to as wafer inscription. The grooves weaken the wafer along the scribe lines but do not cut through the full thickness of a semiconductor wafer. Wafer inscription can be performed with a conventional wafer saw. Alternatively, a device scratches or otherwise creates a weakness or defect along the scribe lines of the wafer. After the wafer inscription, the wafer is placed and held on a wafer breaking stage, which has an elastic layer thereon. Then, an external means such as a roller presses the wafer so that the wafer breaks along the scribe lines into individual semiconductor chips.

Figure 7:
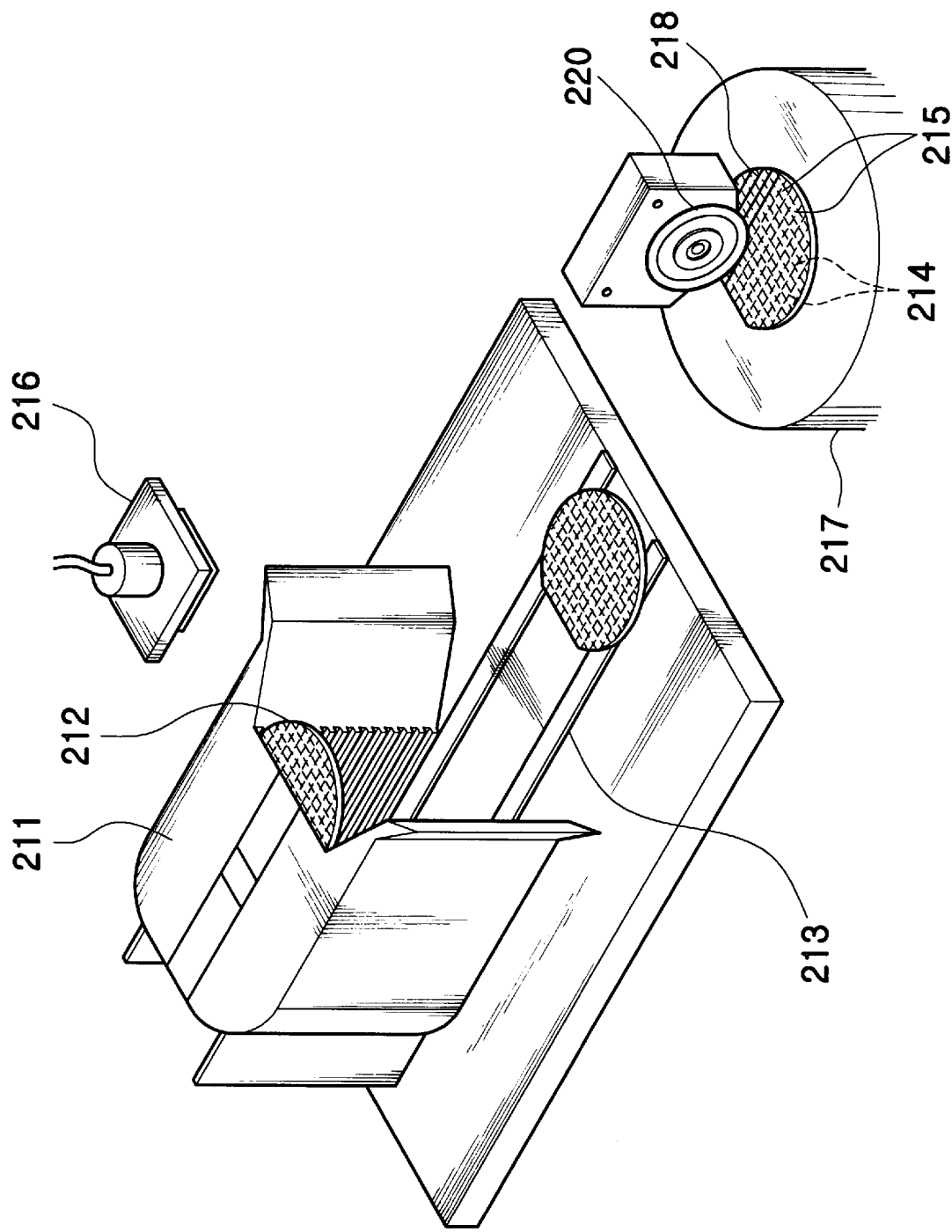
FIG. 7 is a schematic diagram showing a wafer inscribing process according to an embodiment of the present invention.
Figure 8:
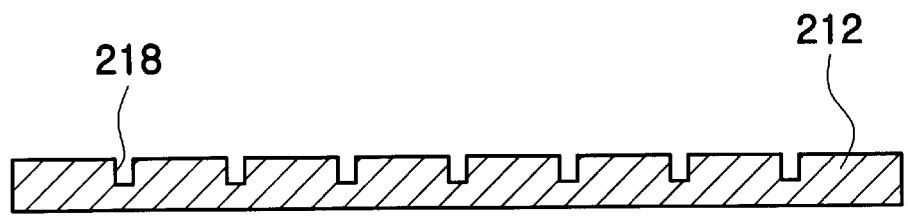
FIG. 8 is a cross-sectional view of a semiconductor wafer after a wafer inscribing process according to an embodiment of the present invention.
Figure 9:
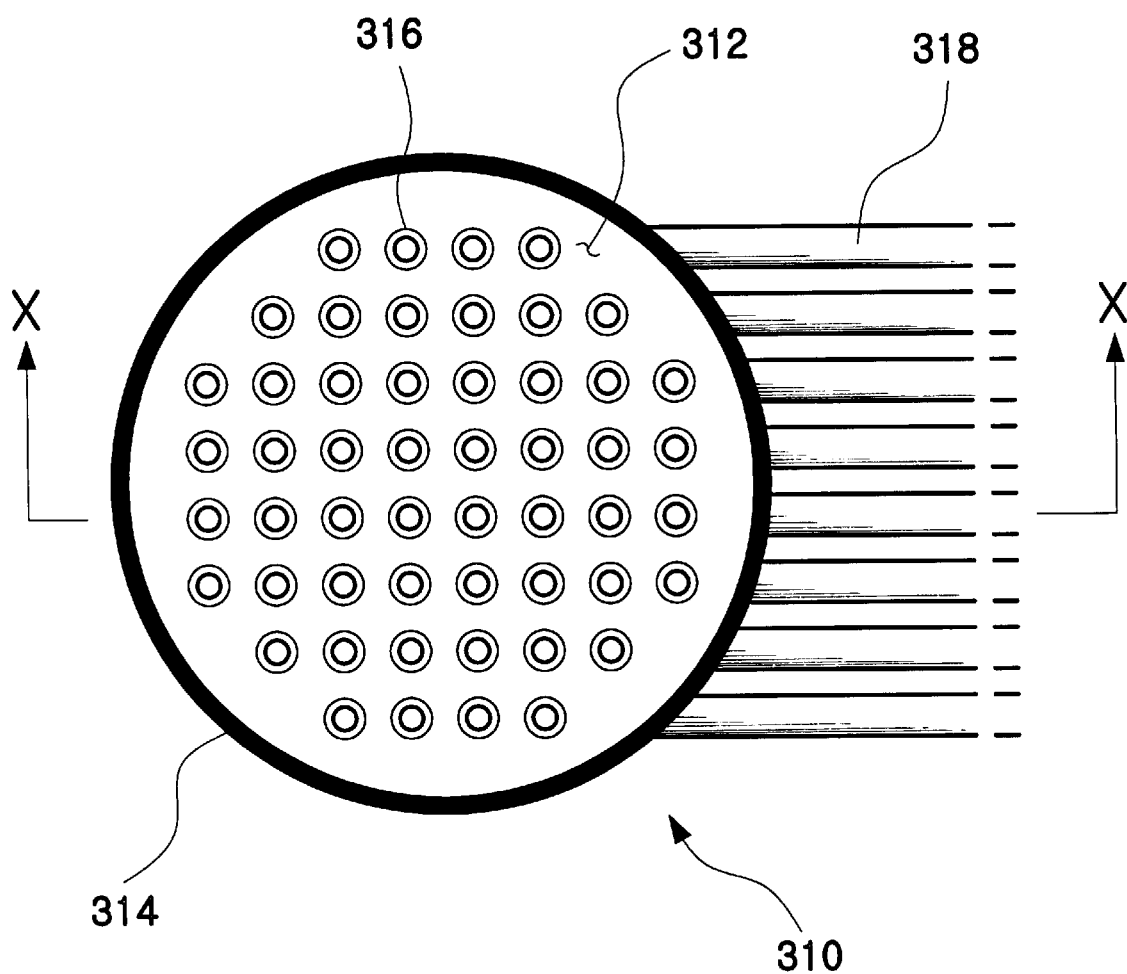
FIG. 9 is a plan view of a wafer breaking stage according to an embodiment of the present invention.

FIGS. 7 and 8 illustrate a method for inscribing a semiconductor wafer 212 according to an embodiment of the present invention. For wafer inscription, wafer 212 is transferred from a conventional wafer cassette 211 to a wafer cutting stage 217 by a transferring means such as a conveyer belt 213 and a wafer pick-up tool 216. Wafer pickup tool 216 applies suction to wafer 212, lifts wafer 212 from conveyor belt 213, and places wafer 212 on cutting stage 217.

After being transferred, a vacuum suction force from cutting stage 217 holds wafer 212 on cutting stage 217. Then, an inscriber such as a rotating diamond blade 220 inscribes wafer 212 along scribe lines 214 which are along boundaries that separate chips 215. The wafer inscription forms grooves 218 along scribe lines 214 as shown in FIG. 8. The depth of grooves 218 is preferably about 40% to 60% of the thickness of wafer 212. However, the groove depth ratio to the wafer thickness can be varied according to process conditions, such as wafer size and wafer handling equipment. Instead of blade 220, a laser striking along scribe lines 214 can inscribe wafer 212. Grooves 218 facilitate later breaking of wafer 212 into individual semiconductor chips 215.

The wafer inscribing produces debris, which must be removed before a die attaching process. After completing wafer inscription, inscribing stage 217 releases wafer 212, and a wafer transferring means (not shown) transfers wafer 212 from inscribing stage 217 to a cleaning station (not shown). The cleaning station cleans wafer 212 with DI (De-Ionized) water and dries wafer 212. Then, the wafer transferring system transfers wafer 212 from the cleaning station to wafer cassette 211, and cassette 211 is transferred to a wafer breaking apparatus. It is convenient that the wafer breaking apparatus be next to or integrated in a die attaching apparatus.

FIGS. 9 through 12 illustrate a wafer breaking system and process in accordance with an embodiment of the invention. Wafer 212 having its scribe lines 214 inscribed is placed on an elastic structure 312 of a wafer breaking stage 310 shown in FIG. 9. Elastic structure 312 is formed of an elastic material such as silicon rubber or urethane rubber and includes a flat top through which vacuum suction holes 316 pass. The size and locations of suction holes 316 are such that each suction hole 316 can be aligned with a corresponding one of the semiconductor chips 215 of wafer 212. Each suction hole 316 is smaller than a semiconductor chip 215 and preferably has a diameter between 0.3 mm and 1.0 mm. Suction pipes 318 connect holes 316 to a vacuum pump (not shown).

Figure 10:
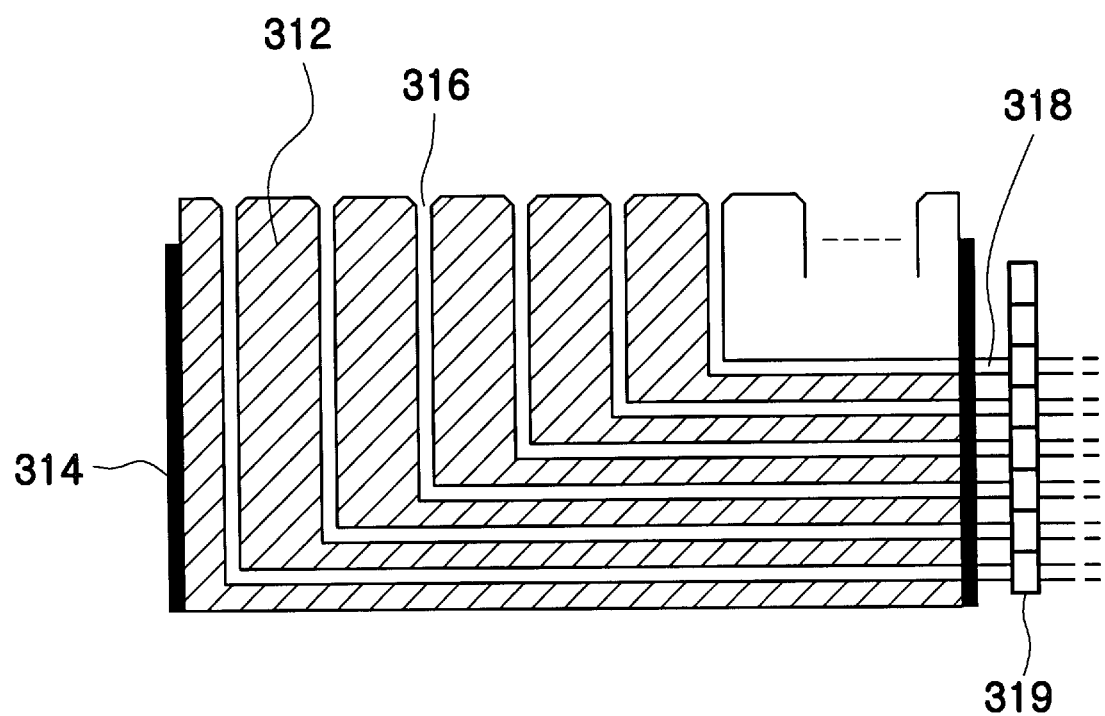
FIG. 10 is a cross-sectional view taken along line X—X of FIG. 9.

As shown in FIG. 10, holes 316 extend from the top to a side surface of elastic structure 312, but other configurations are also suitable. Solenoid valves 319 are in pipes 318 and control the vacuum or pressure that suction holes 316 apply to the back surface of a wafer. A tungsten ring 314 surrounds elastic structure 312 for easy handling of stage 310.

Figure 11:
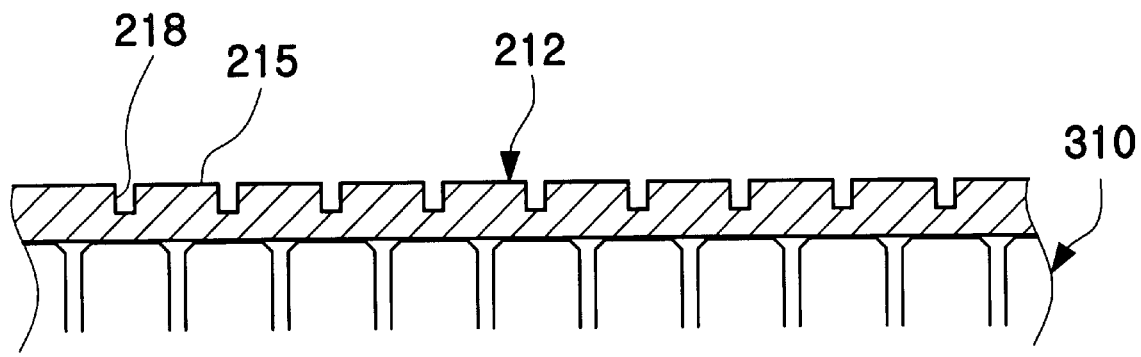
FIGS. 11 and 12, which are cross-sectional views of a semiconductor wafer on a wafer breaking stage, depict a wafer breaking process.
Figure 12:
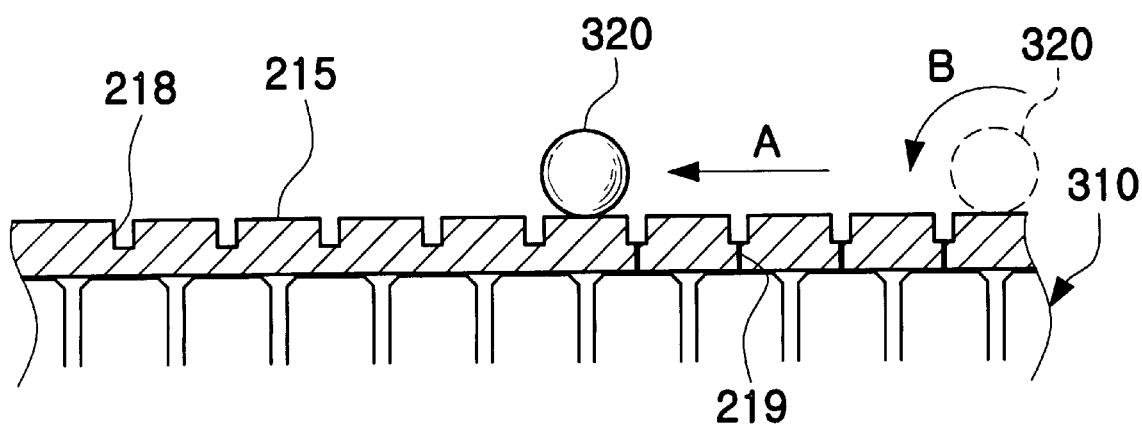

An aligning stage aligns vacuum suction holes 316 with semiconductor chip 215 of wafer 212 for placement of wafer 212 on wafer breaking stage 310 as shown in FIG. 11. When wafer 212 is on wafer breaking stage 310 with vacuum suction holes 316 under corresponding semiconductor chips 215, opening solenoid valves 319 applies a vacuum through vacuum suction holes 316 to hold wafer 212. Then, as shown in FIG. 12, a press such as a roller bar 320, which has a cylindrical shape, applies mechanical force to wafer 212 to break wafer 212 along grooves 218 so that semiconductor chips 215 are separated. Preferably, the mechanical force is controlled so as to produce breaking planes 219 perpendicular to the top surface of wafer 212. The external surface of roller bar 320 can be made of an elastic material such as rubber to prevent physical damage on semiconductor chips 215 when roller bar 320 rolls on the top surface of wafer 212. Roller bar 320 is also treated to prevent electrostatic discharge damage on semiconductor chips 215. Symbols A and B in FIG. 12 denote the directions of motion and rotation of roller bar 320. After the wafer breaking, stage 310 maintains the vacuum to hold the separated semiconductor chips 215 in place until a subsequent die attaching process.

Figure 13:
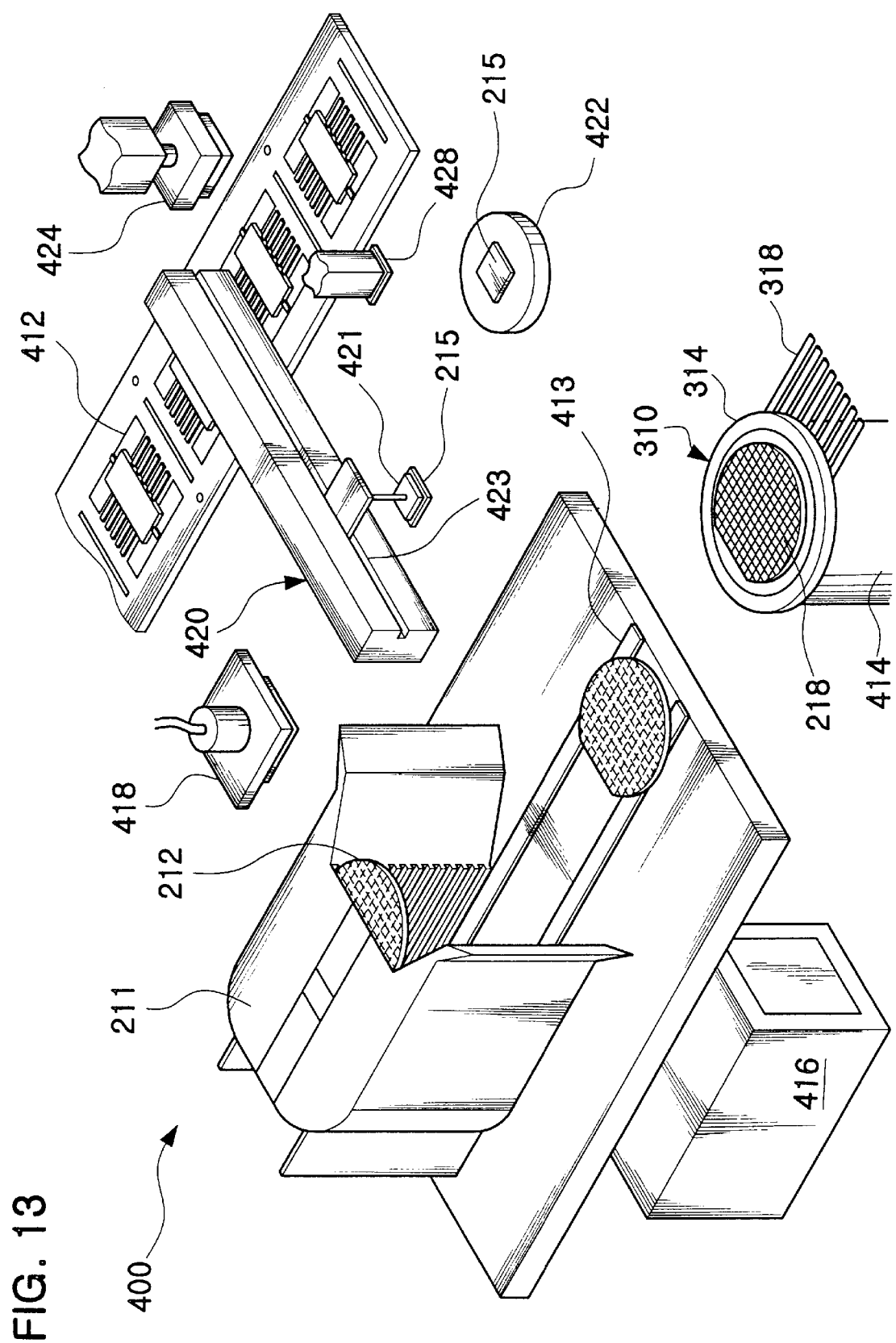
FIG. 13 depicts a die attaching system according to an embodiment of the present invention.
Figure 14:
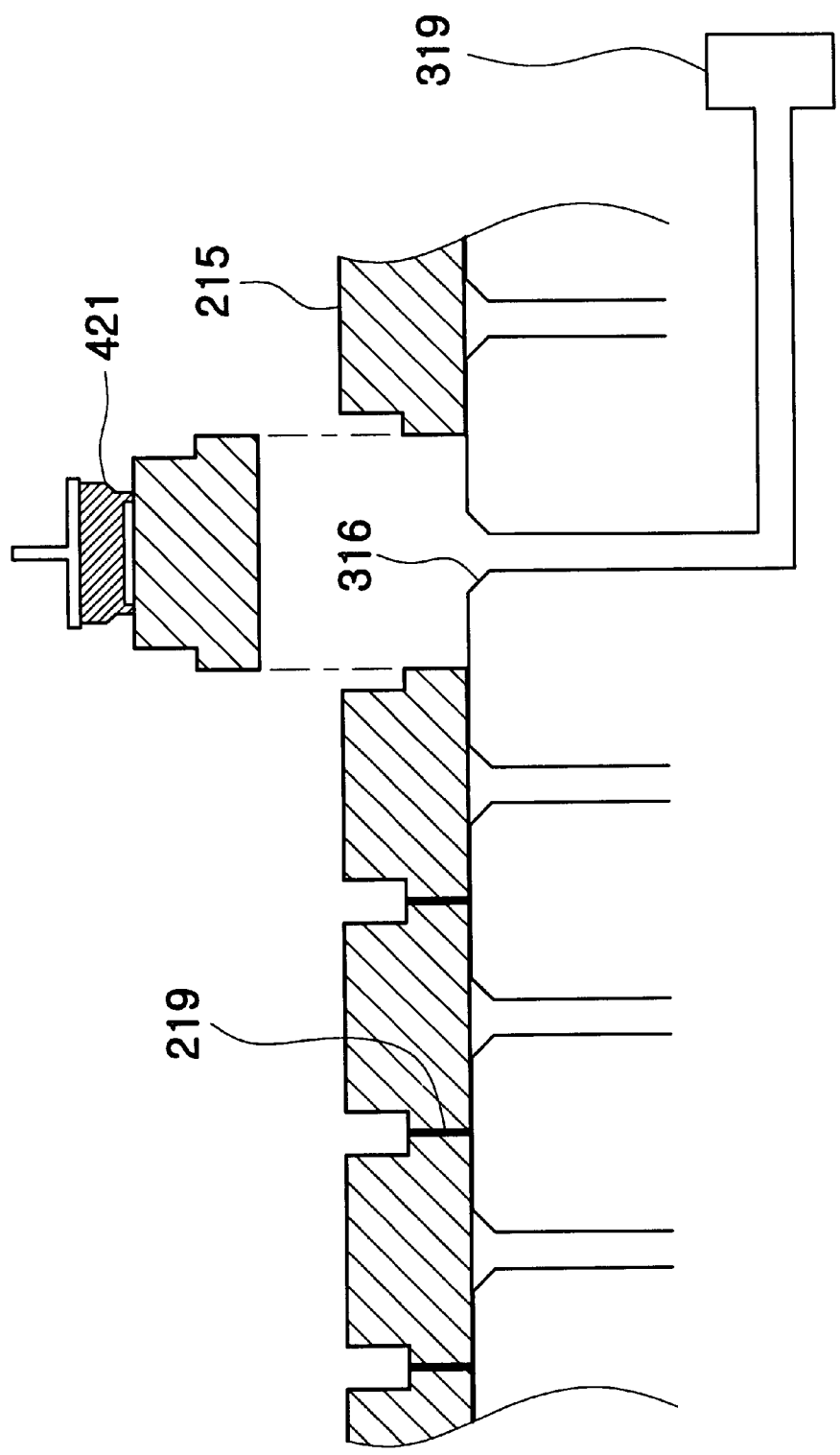
FIG. 14 is a cross-sectional view of a semiconductor wafer on a wafer breaking stage and depicts a die pick-up according to an embodiment of the present invention.

FIG. 13 is a perspective view depicting a system 400 for a die attachment process in accordance with an embodiment of the present invention, and FIG. 14 is a perspective view illustrating a die pick-up for the die attachment process. The die attachment process attaches separated semiconductor chips 326 to a lead frame 412 shown in FIG. 13. Wafer breaking stage 310 is on an alignment table 414 of system 400 and holds the semiconductor chips which were separated as described above. Since wafer 212 was only partially cut, and stage 310 holds separate chips 326 in place, wafer tape and a wafer ring are not required or transferred from wafer sawing equipment to die attachment equipment 400. Thus, wafer 212 does not require special or separate storage boxes for moving and handling. When wafer cassette 211 is on system 400, conveyor belt 413 transfers wafers 212 one by one from wafer cassette 211. A wafer pickup tool 418 lifts each wafer 212 using vacuum forces and mounts the wafer 212 on stage 310, which alignment table 414 helps align with wafer 212. Then, stage 310 fixes the wafer 212 also using a vacuum, and a press breaks wafer 212 into separate semiconductor chips.

After wafer inscription and breaking to separate chips, a chip transferring robot arm 420 which includes a collet 421 and a slit 423 transfers a semiconductor chip 215 from wafer breaking stage 310 to a die bonding stage 422. When collet 421 picks up semiconductor chip 215 using vacuum force, solenoid valve 319 corresponding to semiconductor chip 215 is closed to release semiconductor chip 215, while other solenoid valves 319 remain open to hold the other chips in place on stage 310. Slit 423 guides the movement of collet 421 from stage 310 to die bonding stage 422.

A camera 428 checks the position of semiconductor chip 215 placed on die bonding stage 422. According to the result of the check, bonding stage 422 aligns semiconductor chip 215 under a lead frame 412, and a bonding head 424 presses lead frame 412 on semiconductor chip 215. Typically, lead frame 412 has an adhesive tape (not shown), which is a bonding medium between semiconductor chip 215 and lead frame 412, and is transported by a lead frame handling means that can be found in a conventional die attaching apparatus for LOC (Lead-On-Chip) packaging.

After attaching of all semiconductor chips 215 of wafer 212 to lead frames, edge portions of wafer 212 remain on wafer breaking stage 310. To remove the edge portions, elastic structure 312 is detached from wafer breaking stage 310, and the edge portions are discarded in a waste box 416. Then, air is blown through elastic structure 312 to remove debris, and elastic structure 312 is installed again in wafer breaking stage 310.

Since semiconductor wafer 212 is handled without wafer tape, the present invention can avoid such problems as package cracking and delamination caused by wafer tape adhesive stuck to a semiconductor chip.

Although specific embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for semiconductor chip packaging, comprising:
    (a) inscribing a semiconductor wafer along scribe lines, the semiconductor wafer including semiconductor chips;
    (b) placing the semiconductor wafer on a stage that includes holes through which a vacuum is applied, wherein the respective semiconductor chips are aligned with the corresponding holes;
    (c) holding the semiconductor wafer to the stage using the vacuum applied through the holes of the stage; and
    (d) breaking the semiconductor wafer along the scribe lines by applying mechanical force to the semiconductor wafer.

2. The method of claim 1, wherein inscribing the semiconductor wafer produces grooves along the scribe lines, wherein a depth of the grooves is between 40% and 60% of a thickness of the semiconductor wafer.

3. The method of claim 2, wherein a rotating diamond blade forms the grooves.

4. The method of claim 2, wherein a laser striking the scribe lines forms the grooves.

5. The method of claim 1, wherein the holes extend from a top surface of the stage, through the stage, to a side surface of the stage.

6. The method of claim 1, wherein each of the holes connects to a valve.

7. The method of claim 1, wherein a top surface of the stage is made of an elastic material.

8. The method of claim 7, wherein the elastic material is selected from a group consisting of silicon rubber and urethane rubber.

9. The method of claim 1, wherein breaking the semiconductor wafer is performed by pressing the semiconductor wafer with a roller.

10. The method of claim 9, wherein an external surface of the roller is made of an elastic material.

11. The method of claim 1, further comprising cleaning the inscribed semiconductor wafer before placing the semiconductor wafer on the stage.

12. The method of claim 1, further comprising, after breaking the semiconductor wafer, picking up a first separated semiconductor chip while releasing vacuum suction force on the first separated semiconductor chip.

13. The method of claim 12, wherein the other separated semiconductor chips remain held to the stage by vacuum suction force when the first separated semiconductor chip is picked up.

14. A method for semiconductor chip packaging, comprising:
    (a) inscribing a semiconductor wafer along scribe lines, the semiconductor wafer including semiconductor chips, wherein inscribing the semiconductor wafer produces grooves along the scribe lines, wherein a depth of the grooves is between 40% and 60% of a thickness of the semiconductor wafer;
    (b) placing the semiconductor wafer on a stage that includes holes through which a vacuum is applied, wherein the respective semiconductor chips are aligned with the corresponding holes, and a top surface of the stage is made of an elastic material;
    (c) holding the semiconductor wafer to the stage using the vacuum applied through the holes of the stage; and
    (d) breaking the semiconductor wafer along the scribe lines by applying mechanical force to the semiconductor wafer.

15. The method of claim 14, wherein the holes extend from a top surface of the stage, through the stage, to a side surface of the stage.

16. The method of claim 14, wherein breaking the semiconductor wafer is performed by pressing the semiconductor wafer with a roller.

17. The method of claim 16, wherein an external surface of the roller is made of an elastic material.

18. The method of claim 14, further comprising, after breaking the semiconductor wafer, picking up a first separated semiconductor chip while releasing vacuum suction force on the first separated semiconductor chip.

19. The method of claim 18, wherein the other separated semiconductor chips remain held to the stage by vacuum suction force when the first separated semiconductor chip is picked up.

* * * * *